United States Patent [19]

Petrmichl et al.

[11] Patent Number: 5,618,619
[45] Date of Patent: Apr. 8, 1997

[54] HIGHLY ABRASION-RESISTANT, FLEXIBLE COATINGS FOR SOFT SUBSTRATES

[75] Inventors: Rudolph H. Petrmichl, Center Valley; Bradley J. Knapp, Kutztown; Fred M. Kimock, Macungie; Brian K. Daniels, Emmaus, all of Pa.

[73] Assignee: Monsanto Company, St. Louis, Mo.

[21] Appl. No.: 205,954

[22] Filed: Mar. 3, 1994

[51] Int. Cl.$^6$ .................................................. B32B 9/04
[52] U.S. Cl. ...................... 428/334; 427/527; 427/534; 427/563; 427/577; 427/579; 428/336; 428/412; 428/446; 428/447; 428/908.8; 428/913
[58] Field of Search .................................. 428/412, 429, 428/430, 432, 446, 447, 448, 450, 908.8, 913, 332, 334, 220, 336; 427/534, 563, 562, 577, 579, 527

[56] References Cited

U.S. PATENT DOCUMENTS

| | | | |
|---|---|---|---|
| 3,847,652 | 11/1974 | Fletcher et al. | 117/93.1 GD |
| 4,085,248 | 4/1978 | Zehender et al. | 428/336 |
| 4,096,315 | 6/1978 | Kubacki | 428/412 |
| 4,168,330 | 9/1979 | Kaganowicz | 427/39 |
| 4,217,038 | 8/1980 | Letter | 351/160 R |
| 4,382,100 | 5/1983 | Holland | 427/38 |
| 4,490,229 | 12/1984 | Mirtich et al. | 204/192 C |
| 4,649,071 | 3/1987 | Tajima et al. | 428/212 |
| 4,661,409 | 4/1987 | Kieser et al. | 428/408 |
| 4,762,730 | 8/1988 | Enke et al. | 427/40 |
| 4,777,090 | 10/1988 | Ovshinsky et al. | 428/408 |
| 4,778,721 | 10/1988 | Sliemers et al. | 428/336 |
| 4,783,374 | 11/1988 | Custer et al. | 428/447 |
| 4,830,873 | 5/1989 | Benz et al. | 427/35 |
| 4,842,941 | 6/1989 | Davies et al. | 428/412 |
| 4,862,032 | 8/1989 | Kaufman et al. | 313/359.1 |
| 4,927,704 | 5/1990 | Reed et al. | 428/221 |
| 4,942,065 | 7/1990 | Factor et al. | 427/387 |
| 4,990,376 | 2/1991 | Patel | 427/387 |
| 5,051,308 | 9/1991 | Reed et al. | 428/412 |
| 5,061,567 | 10/1991 | Brochot et al. | 428/428 |
| 5,093,153 | 3/1992 | Brochot et al. | 427/41 |
| 5,135,808 | 8/1992 | Kimock et al. | 428/336 |
| 5,190,807 | 3/1993 | Kimock et al. | 428/216 |
| 5,268,217 | 12/1993 | Kimock et al. | 428/216 |
| 5,508,368 | 4/1996 | Knapp et al. | 427/534 |

FOREIGN PATENT DOCUMENTS

| | | |
|---|---|---|
| 0299754 | 1/1989 | European Pat. Off. . |
| 0395198 | 10/1990 | European Pat. Off. . |
| 0528540 | 2/1993 | European Pat. Off. . |

OTHER PUBLICATIONS

Wrobel, A.M., Kryszewski, M. Progr. Colloid Polym. Sci., vol. 85, p. 91 (1991).

*Primary Examiner*—Hoa T. Le
*Attorney, Agent, or Firm*—Coudert Brothers

[57] ABSTRACT

An abrasion wear resistant coated substrate product is described comprising a substrate and an abrasion wear resistant coating material comprising carbon, hydrogen, silicon, and oxygen. The abrasion wear resistant coating material has the properties of Nanoindentation hardness in the range of about 2 to about 5 GPa and a strain to microcracking greater than about 1% and a transparency greater than 85% in the visible spectrum. The coated products of the present invention are suitable for use in optical applications such as ophthalmic lenses or laser bar code scanner windows. In the method for making the products, the substrate is first chemically cleaned to remove contaminants. In the second step, the substrate is inserted into a vacuum chamber, and the air in said chamber is evacuated. In the third step, the substrate surface is bombarded with energetic ions and/or reactive species to assist in the removal of residual hydrocarbons and surface oxides, and to activate the surface. After the substrate surface has been etched, a protective, abrasion-resistant coating is deposited by plasma or ion beam deposition. Once the chosen thickness of the coating has been achieved, the deposition process on the substrates is terminated, the vacuum chamber pressure is increased to atmospheric pressure, and the coated substrate products having improved abrasion-resistance are removed from the vacuum chamber.

91 Claims, 2 Drawing Sheets

HIGHLY ABRASION-RESISTANT, FLEXIBLE COATINGS FOR SOFT SUBSTRATES

FIELD OF THE INVENTION

This invention relates generally to coatings which protect the substrate from wear and abrasion. More particularly, the invention relates to coatings which are useful in protecting substrates such as plastic sunglass lenses, ophthalmic lenses, and bar code scanner windows, from scratches and abrasion, and a method for making the same.

BACKGROUND OF THE INVENTION

There are numerous prior art methods for coating substrates to improve their performance, e.g. lifetime, abrasion wear resistance and similar properties. For example, consider the case of plastic sunglass lenses or plastic prescription eyewear. Due to the ease of scratching plastic, abrasion-resistant coatings are desired which can protect the surface of plastic lenses and extend their useful lifetime. The attributes desired for such a coating are high transmission of visible light, high clarity, total absence of color, abrasion protection as good as or better than glass, chemical protection in case of safety glasses, and ability to withstand moisture, heat, and UV radiation.

Non-brittle behavior, associated with flexibility, is also desirable so that degradation in the impact resistance of the lens is avoided, and deep scratches are less noticeable. Other optically transmissive applications may require outright flexibility. Flexibility or conversely brittle behavior, can be quantified by stretching or bending a sample with the coating on the convex surface and measuring the % elongation ($100 \Delta L/L$) at which the coating fails, i.e. develops fine cracks. This will be referred to herein as the strain to microcracking. Coatings for aircraft windows, for example, must have at least 1% strain to microcracking. Likewise windows for boat sails or automobile convertible tops should be flexible enough that they can be folded without incurring permanent damage. To make such a coating marketable, the process of deposition must be rapid, inexpensive, reliable and reproducible.

Plastic lenses sold into the ophthalmic lens market are largely coated by acrylic and polysiloxane dip-coatings or spin coatings. These coatings significantly improve the abrasion resistance of the coated lens compared to the uncoated lens. This is particularly true for the case of polycarbonate which is very subject to abrasion. However, improved abrasion resistance of coated lenses is still a major problem in the ophthalmic lens industry. The industrial goal is to obtain plastic lenses which exhibit the same abrasion resistance as glass lenses. Current commercial plastic lenses have abrasion resistance characteristics which are poor compared to glass. Therefore, when purchasing lenses, one must choose between glass, which is very abrasion-resistant but is heavier, or plastic which is lighter but much less abrasion-resistant.

It is well known that plasma deposition produces coatings that can provide much better abrasion resistance, chemical inertness, and the like, than coatings generated by the wet chemical methods mentioned above. Very hard, amorphous coatings can be readily made, for example, by placing the substrate on the capacitively coupled ("powered") electrode in a radio frequency reactor, and exposing the substrate to a high-power and low-pressure methane plasma. Such coatings, commonly referred to as diamond-like carbon (DLC), can likewise be produced by exposing the substrate to a beam of energetic hydrocarbon ions generated at very low pressures in an ion source.

In the radio frequency plasma, as in the ion beam process, the substrate is also irradiated by energetic ions from the plasma, due to the presence of a large negative bias voltage on the powered electrode. When substrates are mounted remotely from the powered electrode, they experience only low energy ion irradiation (less than 20 eV). The properties of the coatings are sensitively dependent on the energy of the ions, i.e., bias voltage, which can be controlled by adjusting radio frequency power and pressure. A low bias voltage will generally produce polymeric coatings which are soft, yellow, and have a strain to microcracking beyond 5%, and have low internal stress. Under high bias voltages, on the other hand, the coatings are very hard (hence the term diamond-like), black, brittle, and have high internal compressive stress.

There are many techniques wherein the deposition takes place without energetic ion bombardment. In these so-called plasma polymerization processes, control of coating properties such as hardness are primarily achieved by selecting the appropriate precursor gas chemistry, substrate temperature, and W/FM parameter. The W/FM parameter is the plasma energy per unit mass of monomer, where W is the power, F is the volume flow rate, and M is the molecular weight of the precursors; see Sharma A, and Yasuda H., J. Appl. Polym. Sci., vol. 38, page 741 (1980). On the other hand, ion-assisted processes have the additional parameter of ion bombardment which provides one with more control of the coating properties and hence a wider choice of process conditions. Ion bombardment affects not only the density and hardness, but also the morphology of the coating which determines the optical clarity, i.e. the degree to which the coating scatters light and appears hazy.

It is commonly known that protection of soft substrates from abrasion caused by fine grit, as is found in the CS10F Taber wheel used in abrasion testing, requires coating thickness in excess of 1 micron (micrometer). Due to the high compressive stress it is difficult to deposit DLC on soft plastics such as polycarbonate to thicknesses greater than 0.5 microns without the formation of stress cracks. DLC is therefore unsuitable as an abrasion protective layer on such substrates. While the softer plasma polymers can be deposited to much greater thicknesses, coatings of this type made from hydrocarbon precursor gases can not be used in applications requiring water-white coatings.

It is well known that the color of the coating is greatly reduced if organosilicon feed gases are used instead of hydrocarbons. However when using alkylsiloxane or alkylsilazane feed gases, which respectively have Si—O—Si or Si—NH—Si linkages, the abrasion resistance is not much better than that of wet chemical polysiloxane coatings. It is also well known, on the other hand, that if these monomers are mixed with oxygen, the coating hardness increases. It is known that the use of alkoxysilanes (which have Si—O—C linkages), also produces harder coatings.

Because it is generally believed that coatings as hard as glass are required in order to achieve glass-like abrasion resistance, the emphasis in the prior art has been to use dilute mixtures of silanes or organosiloxanes in $O_2$, or to use organosilicon precursors rich in alkoxy substituents. Much of the prior art was done by plasma polymerization techniques without substrate bias. Ion bombardment is beneficial in that it enhances the surface mobility of the depositing species and leads to smoother and less hazy coatings. In plasma polymerization techniques such as microwave deposition, the same effect can be achieved by increasing the substrate temperature, however, this is limited by the temperature stability of the substrate. Furthermore, deposition of hard coatings by plasma polymerization requires high W/FM and low pressures conditions, and thus the deposition rates are typically much lower than in the ion-assisted methods. While microwave deposition can produce rates similar to ion assisted methods, high discharge power density can produce submicron particles in the plasma, which in turn can lead to hazy coatings; see Wrobel, A. M., Kryszewski, M., Progr. Colloid Polym. Sci., vol. 85, page 91 (1991).

The following references illustrate prior art coating processes and abrasion-resistant coatings:

Zehender et al., U.S. Pat. No. 4,085,248, describe a plasma polymerization method for making a protective coating for an optical reflector by first coating the reflector with evaporated Al and then depositing an organosilicon layer from a hot filament generated electrical discharge.

Kubachi, U.S. Pat. No. 4,096,315, discloses a process for producing a protective coating on an optical polymer substrate that includes plasma polymerization of an organosilicon gas, followed by exposure to a non-depositing plasma for crosslinking and stress relief. Kubachi teaches that the intrinsic stress of his coatings limits their thickness on plastics to less than 3 µm.

Kaganowicz, U.S. Pat. No. 4,168,330, describes a process for depositing a silicon dioxide layer on a substrate by activating a mixture of cyclic siloxanes and oxygen "around the substrate by means of a glow discharge." It is taught that this plasma polymerization process was designed for depositing thin dielectric layers on audio/video discs.

Letter, U.S. Pat. No. 4,217,038, discloses and claims an oxygen permeable, soft, and flexible contact lens comprising a polysiloxane lens and a radio frequency sputter-deposited $SiO_2$ layer which is thinner than 8000 Å. Letter teaches that this coated lens can be folded or bent back upon itself without breaking. In the deposition process the lens was not biased, and thus the permeable coating was evidently not fully dense. In any event, it is well known that such thin coatings will provide little abrasion resistance.

Tajima et al., U.S. Pat. No. 4,649,071, disclose and claim a substrate with a two component graded single layer or multilayer structure, with more adhesive component on the substrate side of the coating and more protective component on the other side. The change in coating properties is achieved, in this plasma polymerization process, purely by changing feed gas composition.

Kieser et al., U.S. Pat. No. 4,661,409, describe a microwave deposition method for producing hard DLC coatings over large surface areas, using siloxane or silazane interlayers for improved adhesion.

Enke et al., U.S. Pat. No. 4,762,730, disclose and claim a biased radio frequency plasma process for depositing a transparent protective coating on an optical plastic substrate. Made from a mixture of either siloxane or silazane monomers and oxygen, with the oxygen partial pressure at least five times greater than that of the monomer, this process produces essentially silicon dioxide coatings that are as hard or harder than quartz.

Ovshinsky et al., U.S. Pat. No. 4,777,090, describe a microwave deposition process for making a compositionally graded coating on soft substrates consisting essentially of carbon at the substrate and $SiO_x$ remote from the substrate, where x is from 1.6 to 2.0. The role of the carbon interfacial layer is to improve adhesion. Data was presented which indicates that these coatings can be hazy at the level of 5%.

Sliemers et al., U.S. Pat. No. 4,778,721, disclose a method for making an abrasion-resistant plasma coating by restricting the monomer to alkoxy substituted silanes, or mixtures of these with 30% or less of oxygen. It is taught that these coatings are much harder than those obtained from conventional organosilicon monomers, such as hexamethyldisiloxane. Also according to the teachings, these coatings can be made in a variety of "conventional" plasma reactors, but the inventors refer specifically to the reactor of Fletcher et al., U.S. Pat. No. 3,847,652, which has no provisions for biasing the substrate.

Custer et al., U.S. Pat. No. 4,783,374, disclose a coated article with a plasma generated abrasion-resistant and substantially transparent coating made from a precursor gas mixture of a silane, an alkene, and oxygen. Both radio frequency and microwave deposited coatings are discussed. According to the teachings, "reducing the radio frequency power to less than 200 W (0.6 W/in$^2$ cathode area) reduces yellowness". The "glass-like" abrasion performance demonstrated in this patent was therefore achieved with a yellow coating.

Benz et al., U.S. Pat. No. 4,830,873, disclose and claim a process for making thin transparent coatings by applying a monomeric vapor of organic compositions, and forming a protective layer from an electrical gas discharge by means of polymerization from the vapor phase with the assistance of radiation, followed by the addition of substances which improve the layer hardness. It is taught that the preferred range for organosilicon and oxygen mixtures is 1:8 to 1:16 which produces hard $SiO_2$-like material.

Devins et. al., U.S. Pat. No. 4,842,941, disclose and claim a method for making an abrasion-resistant coating on polycarbonate by using a wet-chemical produced interlayer and then plasma depositing an inorganic top layer such as $SiO_2$.

Reed et al., U.S. Pat. No. 4,927,704, disclose and claim a plasma method of making an abrasion-resistant coating with a graded structure which changes from the substrate outward from organosilicon material to abrasion-resistant inorganic material. The strain to microcracking was measured for two coatings of this invention. Deposited on polycarbonate, and consisting of plasma deposited organosilicon and $SiO_2$ layers, both coatings failed at strains less than 0.5%.

Brochot et al., U.S. Pat. No. 5,061,567, disclose and claim a glass object with metal or metal-oxide layers upon which a thin organosilicon coating is plasma deposited for corrosion protection.

Bonet et al., U.S. Pat. No. 5,093,152, describe a plasma polymerization method for making a coating of composition $SiC_{0-5}N_{0.3-0.8}O_{1.3-2.5}H_{0.5-1.2}$ on plastic optical substrates, by placing the substrate in the afterglow of a plasma and injecting a silicon-containing material near the surface of the substrate.

Kimock, et al., U.S. Pat. Nos. 5,135,808, 5,190,807, 5,268,217 disclose direct ion beam deposition processes using a hydrocarbon gas or carbon vapor for producing abrasion wear resistant products comprising substrates with hard outer coatings of substantially optically transparent diamond-like carbon (DLC) useful for commercial articles such as optical lenses, sunglass lenses, and bar code scanner windows.

Lopata et al., European Pat. No. 0299754, disclose a plasma polymerization method for depositing a "silicon oxide based coating", by exposing the substrate, which is electrically isolated from the system, to a plasma containing an organosilicon compound, oxygen, and an inert gas.

Schmidt and Angus, European Pat. No. 0395198, disclose a composition of matter, which is hydrogenated or nonhydrogenated DLC containing small quantities of silicon, boron, oxygen, or fluorine. The patentees teach in detail how to control hardness, lubricity, density, electrical conductivity, permeability, adhesion and stress, but do not discuss optical properties nor other mechanical properties such as extensibility.

d'Agostino et al., European Pat. No. 0528540, disclose a radio frequency plasma method of making abrasion-resistant coatings from fluorinated cyclic siloxanes.

Relative to optical applications for plastics, the coatings of the prior art listed above suffer from one or more of the following shortcomings:

(1) Not highly transmissive in the visible range.

(2) Not water white.

(3) Not clear (hazy).

(4) Less abrasion-resistant than glass.

(5) Highly stressed (>$5\times10^9$ dynes/cm$^2$) which limits coating thickness and causes bow in the substrate.

(6) Too soft (<2 GPa).

(7) Highly crosslinked, therefore hard but brittle, with hardness equal to or greater than glass (~6 GPa), and strain to microcracking of less than 1%. Brittle failure in very coarse abrasion produces wide microcracked areas along scratches and leads to enhanced and objectionable scattering of light.

(8) Not weatherable, in particular not stable to UV exposure.

SUMMARY OF THE INVENTION

The invention provides improved abrasion-resistant coatings on soft substrates which overcome the shortcomings of the prior art. More particularly, the present invention comprises a coating onto the surface of a substrate which is highly adherent, and exhibits greatly improved wear resistance, flexibility and environmental durability.

The product of the present invention consists of amorphous, conformal, abrasion-resistant coatings comprising the elements of C, Si, H, and O. The coatings may also contain N. The coatings are deposited from precursor gases containing at least the elements of which the coating is comprised. The hardness, stress, and chemistry of the coatings can be tailored to suit the needs of the particular substrate and performance requirements of the coated product. These properties make the coatings of the present invention ideally suited to plastic substrates, such as sunglass and ophthalmic lenses. Coatings which exhibit glass-like abrasion resistance yet high extensibility can be made by the process described below.

The coatings of the present invention may be capped with a top or outer layer of diamond-like carbon to provide additional abrasion protection, chemical resistance, barrier properties and reduced surface friction. The term "diamond-like carbon" is meant to include amorphous materials composed of carbon and hydrogen, whose properties resemble, but do not duplicate, those of diamond. Some of these properties are high hardness (HV=about 1,000 to about 5,000 kg/mm$^2$), low friction coefficient (approximately 0.1), transparency across the majority of the electromagnetic spectrum, and chemical inertness. At least some of the carbon atoms in DLC are bonded in chemical structures similar to that of diamond, but without long range crystal order. These DLC materials can contain up to 50 atomic percent of hydrogen. The DLC coatings are hard, inert and slippery, and are ideal for use in optical as well as many non-optical applications.

The coatings of this invention exhibit the following desirable physical properties:

(1) Hardness, as measured by a Nanoinstrument, Inc. nanoindentor with displacements in the range of about 50 to about 200 nanometers, of about 2 to about 5 GPa;

(2) Strain to microcracking more than 1%; and (3) Transparency greater than 85% throughout the visible spectrum.

BRIEF DESCRIPTION OF THE DRAWINGS

Further features and advantages will become apparent from the following and more particular description of the preferred embodiment of the invention, as illustrated in the accompanying drawing in which.

DETAILED DESCRIPTION OF THE INVENTION

The product of the present invention substantially reduces or eliminates the disadvantages and shortcomings associated with the prior art techniques by providing:

(1) a highly abrasion-resistant, flexible, and extensible coating on a variety of soft substrates;

(2) a highly optically transparent, highly abrasion-resistant coating on optically transparent plastic substrates such as lenses;

(3) a coated substrate which can be manufactured by a process which is readily scaleable to large areas and has high throughput for mass production; and (4) a coating capable of being deposited on a substrate which is not limited to any particular material or geometry.

The method of the present invention comprises the following steps: The substrate is first chemically cleaned to remove contaminants. In the second step, the substrate is inserted into a vacuum chamber and the air in the chamber is evacuated. After evacuation of the chamber, the substrate surface is etched by energetic ions or other reactive species to assist in the removal of residual contaminants such as residual hydrocarbons and surface oxides, and to activate the surface. After the substrate surface has been etched, a protective, abrasion-resistant coating comprising C, H, Si, and O is deposited by using a deposition flux containing C, H, Si, and O. The deposition conditions are adjusted to produce the desired properties in the coating. The coating may contain one or more layers. Diamond-like carbon may be used as a top layer for the coating. Once the chosen thickness of the coating has been achieved, the deposition process on the substrate is terminated, the vacuum chamber pressure is increased to atmospheric pressure, and the coated substrate having improved abrasion-resistance is removed from the vacuum chamber.

In the preferred embodiment of this invention, mixtures of organosiloxane or organosilazane precursor gases and $O_2$ are introduced into the vacuum chamber, and deposition conditions are adjusted so that coatings with the combination of the following seven physical properties are produced, which combination of properties are remarkable when compared to prior art coatings:

(1) Transparency greater than 85% in the visible spectrum;

(2) Yellow index, as defined by ASTM D1925, less than 5, preferably less than 2.5;

(3) Haze, as defined by ASTM D1003, less than 2%;

(4) Hardness, as measured by a Nanoinstrument, Inc. nanoindentor with displacements in the range of about 50 to about 200 nanometers, of about 2 to about 5 GPa;

(5) Less than 2% change in haze during Taber abrasion by ASTM D1044;

(6) Strain to microcracking greater than 1%, preferaby greater than about 2%; and (7) Compressive stress less than $5 \times 10^9$ dynes/cm$^2$.

The combination of transparency greater than 85% throughout the visible spectrum, a yellow index of less than 5, and haze of less than 2% as measured by ASTM D1003 ensures that the coatings of the present invention are suitable for use in optical applications such as ophthalmic lenses or laser bar code scanner windows.

The combination of hardness greater than 2 GPa, strain to microcracking of greater than 1%, and excellent adhesion ensure that the coating will provide excellent abrasion protection on a variety of soft substrates as set forth in (5) above relating to Taber abrasion.

The ability to keep the internal compressive stress of the coating to less than $5 \times 10^9$ dynes/cm$^2$ coupled with excellent adhesion allows the deposition of thick coatings on a variety of substrates. It is necessary to have coating thicknesses greater than one micron in order to obtain excellent abrasion protection on soft substrates. It is preferred to have coating thickness from about 1 to about 100 microns thick.

Excellent adhesion of the protective deposited layer(s) is produced by generating an atomically clean surface prior to the deposition of the coating. The coating is preferably deposited immediately upon completion of the etching step to achieve maximum adhesion to the substrate. Deposition of the coating layer(s) immediately upon completion of the etching step minimizes the possibility for recontamination of the etched surface with vacuum chamber residual gases or other contaminants.

Figure 1:
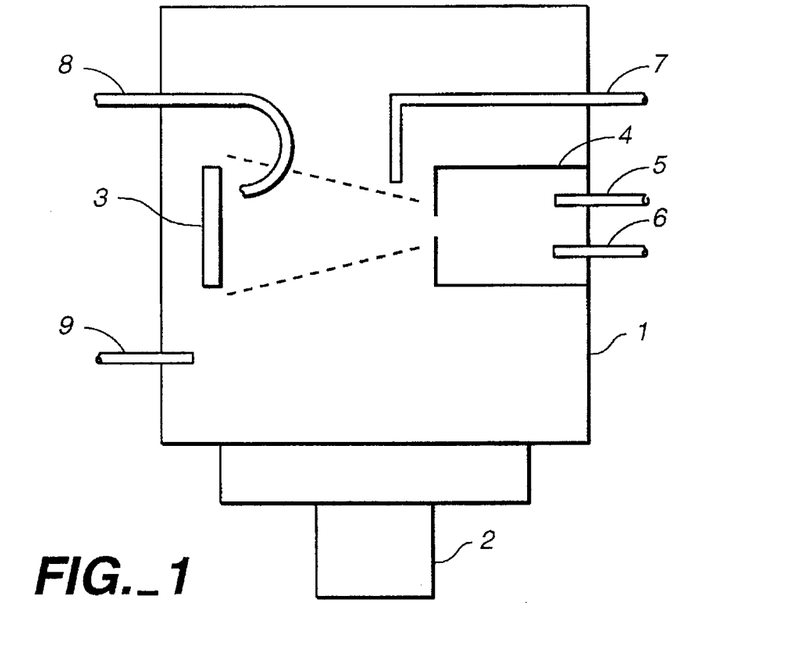
FIG. 1 is a diagrammatic view of an illustrative ion beam deposition apparatus used to manufacture coated substrates of the present invention.

The ion beam apparatus for producing the preferred embodiment of the present invention is illustrated schematically in FIG. 1. The preferred coating process using an ion beam apparatus shown in FIG. 1 is set forth in detail in the application, Ser. No. 08/205,898 (Docket No. 6051/52637) filed on the same date now U.S. Pat. No. 5,508,368; the details of which are incorporated herein by reference. This process is carried out inside a high vacuum chamber 1, which is fabricated according to techniques known in the art. Vacuum chamber 1 is evacuated into the high vacuum region by first pumping with a rough vacuum pump (not shown) and then by a high vacuum pump 2. Pump 2 can be a diffusion pump, turbomolecular pump, cryogenic pump ("cryopump"), or other high vacuum pumps known in the art. Use of a diffusion pump with a cryogenically cooled coil for pumping water vapor is a preferred high vacuum pumping arrangement for producing the products of the present invention. The use of cryopumps with carbon adsorbents is somewhat less advantageous than other high vacuum pumps because such cryopumps have a low capacity for hydrogen which is generated by the ion beam sources used to produce the products of the present invention. The low capacity for hydrogen results in the need to frequently regenerate the adsorbent in the cryopumps.

Substrates to be coated are mounted on substrate holder 3, which may incorporate tilt, simple rotation, planetary motion, or combinations thereof. For coating lenses, domed planetary substrate holders may be used. The substrate holder can be in the vertical or horizontal orientation, or at any angle in between. Vertical orientation, substrates facing downward is preferred to minimize particulate contamination of the substrates, but if special precautions such as low turbulence vacuum pumping and careful chamber maintenance are practiced, the substrates can be mounted in the horizontal position and held in place by gravity. This horizontal mounting is advantageous from the point of view of easy fixturing of small substrates which are not easily clamped in place. This horizontal geometry can be most easily visualized by rotating the illustration in FIG. 1 by 90 degrees.

Prior to deposition, the substrates are etched with an energetic ion beam generated by ion beam source 4. Ion beam source 4 can be any ion source known in the prior art, including Kaufman-type direct current discharge ion sources, radio frequency or microwave frequency plasma discharge ion sources, microwave electron cyclotron resonance ion sources, each having one, two, or three grids, or gridless ion sources such as the Hall Accelerator and End Hall ion source of U.S. Pat. No. 4,862,032; the description of which is incorporated by reference herein. The ion beam is typically charge neutralized by introduction of electrons into the beam using a neutralizer (not shown), which may be a thermionic filament, plasma bridge, hollow cathode, or other types known in the prior art.

Ion source 4 is provided with inlets 5 and 6 for introduction of gases directly into the ion source plasma chamber. Inlet 5 is used for introduction of inert gases, such as argon, krypton, and xenon, for the sputter-etching. Additionally, during the sputter-etching step, oxygen may be introduced in inlet 6, and used independently or mixed with an inert gas to provide chemically-assisted sputter-etching, e.g. for plastic substrates. Inlet 6 is used for introduction of reactive gases such as hydrocarbons (e.g. methane, acetylene, cyclohexane), siloxanes, silazanes, oxygen, nitrogen, hydrogen, ammonia, and similar gases for the coating deposition. During the coating deposition, the reactive gases can be mixed with an inert gas to modify the properties of the resultant coating and improve the stability of the ion source. The reactive gases can also be introduced away from the ion source plasma chamber, but into the ion beam by inlet 7. Inlet 7 may contain multiple holes for the introduction of reactive gases, or may be a "gas distribution ring". Finally, reactive gases for the deposition, e.g. oxygen and ammonia, can be introduced at or near the substrate by inlet 8, or into the chamber background by inlet 9. The reactive gases introduced by inlet 8 modify the properties of the coating by chemical reaction at the surface of the coating during deposition.

Additionally, to improve the deposition rate and throughput of the coating machine, multiple ion sources 4 can be utilized and operated simultaneously. Operation of the ion sources can be sequenced for the case in which different coating materials are deposited from each ion source. As described in U.S. Pat. No. 4,490,229, an additional ion source (not shown) can be used to co-bombard the substrates during coating deposition to alter the film properties.

Figure 2:
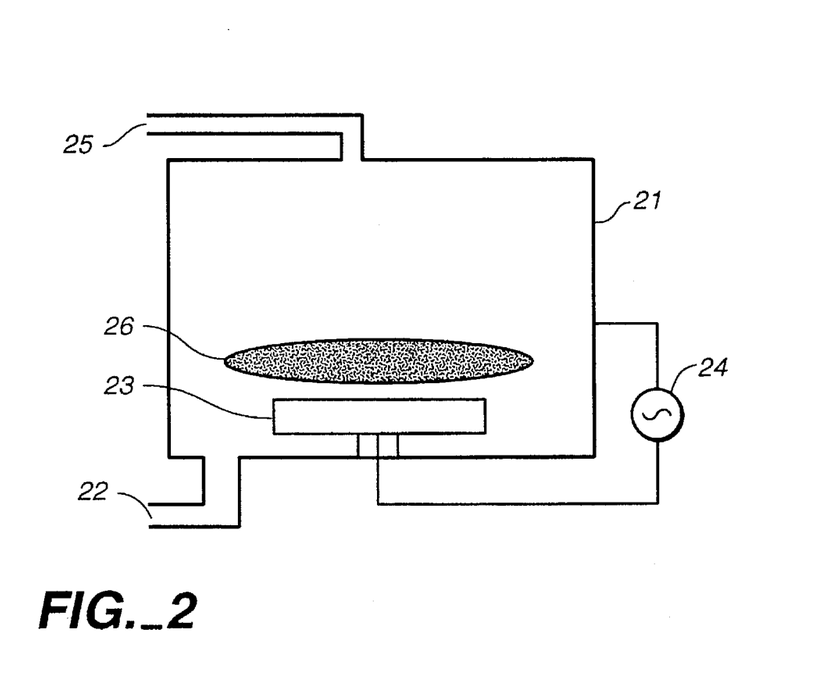
FIG. 2 is a diagrammatic view of an illustrative radio frequency plasma deposition apparatus used to manufacture coated substrates of the present invention.

An example of an ion-assisted plasma deposition apparatus is shown schematically in FIG. 2. The coating is carried out in a vacuum chamber 21, which is fabricated according to the techniques known in the art. Vacuum chamber 21 is evacuated using the vacuum pumping port 22 which is connected to a vacuum pump (not shown). The pump can be a mechanical pump or a mechanical pump/roots blower pumping system. In the system shown, the substrate rests directly on a biased electrode 23, which is connected to the active output of a radio frequency power supply 24, while an additional electrode (not shown) and/or the walls of the grounded chamber 21 are part of the return circuit. There are a great variety of electrode and chamber geometries that can be used to produce the product of the present invention.

Prior to coating by plasma deposition, the substrates are etched with energetic ions and/or reactive species produced in plasma 26. The plasma is typically produced using an inert gas (e.g. argon) or a reactive gas (e.g. hydrogen or oxygen) depending on the substrate to be coated. The gases used for the etching step are introduced through a gas introduction system 25. After etching the substrates, the deposition process is initiated. The precursor gases can be introduced in the chamber by a variety of methods known in the art. Volatile precursors can, for example, be heated in some type of vessel and can be introduced directly into the vacuum chamber simply through a metering valve or by means of special mass flow controllers. The precursor gases are introduced into the plasma 26 through the gas introduction system 25. Operating pressures are typically in the range of about $10^{-3}$ Torr to about 1 Torr and are determined by the gas flow and the pumping speed. The pumping speed may be adjusted through the use of an adjustable aperture in the pumping port 22. A cryogenic trap (not shown) can be included in the pumping system to enhance flow rates of condensible precursors, and to protect the pumps from contamination.

The plasma is initiated and sustained, in this embodiment, by collisions between gas molecules and free electrons oscillating in the radio frequency electric field. Other means of sustaining the plasma are also known such as microwave or direct current discharges. The radio frequency plasma produces large electric fields near the electrode which tend to repel electrons and draw positive ions toward the electrode surfaces. A capacitively coupled electrode 23, which is connected to the power supply 24 through a capacitor, can develop a direct current potential relative to ground. This potential difference is referred to as the bias voltage, and can be measured by an external circuit. In highly asymmetric capacitively coupled systems, where there is a large difference in the electrode surface areas, the bias voltage is an approximate measure of the energy of the ions impacting the smaller electrode.

If a conductor is placed on an electrode 23, it will in effect become part of the electrode 23 and can be coated uniformly regardless of its shape, with some limitations. Sheets or films of plastic can be just as easily coated by placing them in intimate contact with electrode 23.

It is understood that the preferred method to produce the product of the present invention can be carried out in a batch-type vacuum deposition system, in which the main vacuum chamber is evacuated and vented to atmosphere after processing each batch of parts; a load-locked deposition system, in which the main vacuum deposition chamber is maintained under vacuum at all times, but batches of parts to be coated are shuttled in and out of the deposition zone through vacuum-to-air load locks; or in-line processing vacuum deposition chambers, in which parts are flowed constantly from atmosphere, through differential pumping zones, into the deposition chamber, back through differential pumping zones, and returned to atmospheric pressure.

In the preferred method for depositing the coatings of the present invention, the substrate is first chemically cleaned to remove contaminants, such as residual hydrocarbons and other unwanted materials, from the substrate manufacturing and handling processes. Ultrasonic cleaning in solvents, or other aqueous detergents as known in the art is effective. Details of the cleaning procedure depend upon the nature of the contamination and residue remaining on the part after manufacture and subsequent handling. It has been found that it is critical for this chemical cleaning step to be effective in removing surface contaminants and residues, or the resulting adhesion of the coating will be poor.

In the second step of the process, the substrate is inserted into a vacuum chamber, and the air in the chamber is evacuated. For the case of ion beam deposition, typically, the vacuum chamber is evacuated to a pressure of $1\times10^{-5}$ Torr or less to ensure removal of water vapor and other contaminants from the vacuum system. However, the required level of vacuum which must be attained prior to initiating the next step must be determined by experimentation. For the case of the radio frequency plasma deposition, typically, the vacuum chamber is evacuated to $5\times10^{-3}$ Torr or less. The exact level of vacuum is dependent upon the nature of the substrate material, the sputter-etching rate, the constituents present in the vacuum chamber residual gas, and the details of the coating process.

It is not desirable to evacuate to lower pressures than necessary, as this slows down the process and reduces the throughput of the coating system.

In the third step of the process, the substrate surface is bombarded by energetic ions or exposed to reactive species to remove residual contaminants, e.g. any residual hydrocarbons, surface oxides and other unwanted materials not removed in the first step, and to activate the surface. This etching of the substrate surface is required to achieve high adhesion between the substrate surface and the coating layer(s). The etching can be carried out with inert gases such as argon, krypton, and xenon. Additionally, hydrogen or oxygen may be added to the inert gases or used independently to etch and activate the surface. Typically, in order to achieve efficient and rapid ion sputter-etching, the ion energy is greater than 20 eV. Ion energies as high as 2000 eV can be used, but ion energies less than 500 eV result in the least amount of atomic scale damage to the substrate.

Immediately after the substrate surface has been etched, a coating layer is deposited on the substrate by a deposition flux which includes energetic ions and contains the elements C, Si, H, O, and optionally N. The deposition flux is generated by introducing precursor gases containing the elements C, Si, H, O, and optionally N, into a plasma. These precursor gases may be blended with other inert gases, e.g. argon. The precursor gases undergo "activation" in the plasma or in the ion beam itself. Examples of "activation" include, but are not limited to simple electronic excitation, ionization, chemical reaction with other species, ions and neutrals, which may be electronically excited, and decomposition into simpler ionic or neutral species which may be electronically excited. Ions are extracted from the plasma or ion source and strike the surface to be coated with energies from about 10 to about 1500 eV. The ion impact energy depends on the electric field between the point of origin of the ion and the sample, and the loss of energy due to collisions which occur between the ion and other ionic or neutral species prior to the impingement of the ion onto the substrate. Other activated species may also condense on the substrate surface. Neutral species will strike the surface with a variety of energies, from thermal to 100's of eV, depending on the origin of the neutral. This highly energetic deposition process produces highly adherent, very dense and hard coatings on the substrate surface. The density, hardness and other properties of the coating are all very dependent on the energetics of the deposition process as well as the precursor gases used.

In the ion beam process, the primary control parameters are the silicon precursor gas flow, the oxygen gas flow, the pumping speed, and the beam energy and current density. In the ion-assisted plasma process, the primary control parameters are the oxygen to silicon precursor flow rate ratio, the bias voltage, and the substrate temperature. The useful range of the latter is, however, limited for temperatures sensitive substrates such as plastics. Other process parameters that affect the coating properties are the total flow rate, discharge power, pressure, size and shape of electrodes, and the presence of external magnetic fields.

Examples of suitable silicon precursors are the following: hexamethyldisiloxane, hexamethyldisilizane, tetramethylcyclotetrasiloxane, and octamethylcyclotetrasiloxane, and mixtures thereof. In the preferred embodiment, these siloxane and silazane precursor gases are mixed with oxygen and the plasma or ion beam conditons are adjusted to achieve the coating materials of the present invention.

Figure 3:
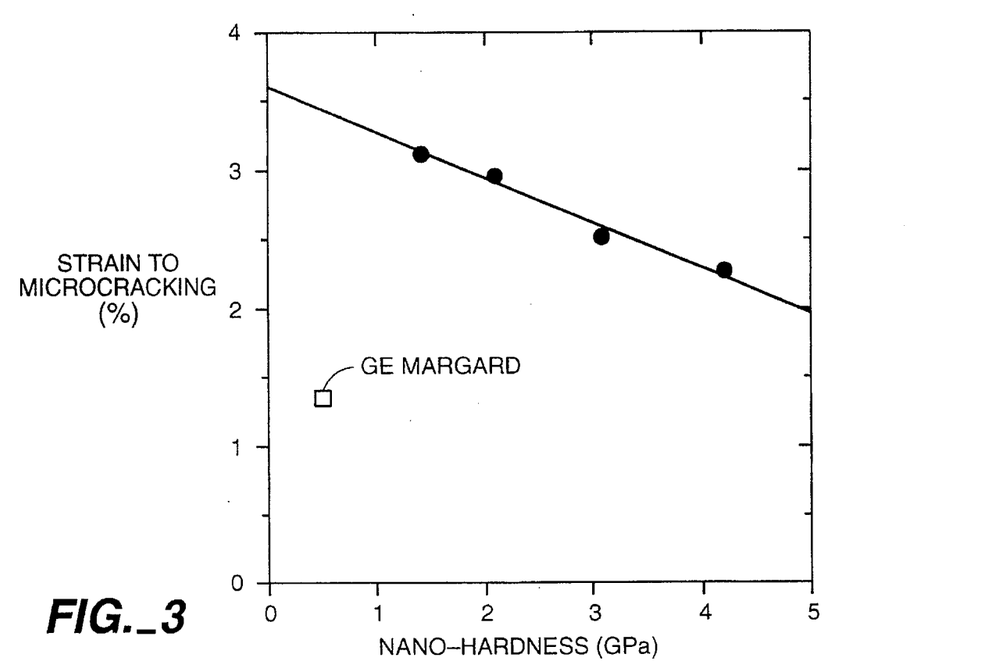
FIG. 3 is a graph of the relationship between hardness and strain to microcracking of some of the coatings of the present invention.

An example of the coating properties within the scope of the present invention is shown in FIG. 3, where the relationship between strain to microcracking and hardness is displayed for a series of coatings deposited by the radio frequency plasma method on polycarbonate substrams. The coatings were made from various $O_2$/hexamethyldisiloxane mixtures, with the harder materials produced with higher $O_2$/hexamethyldisiloxane flow ratios. Details of the process conditions are provided in Example A. These data indicate an inverse relationship between hardness and flexibility; soft materials tend to be flexible, while hard materials are generally not. Yet, surprisingly, General Electric's Margard MR5 (a commercially available polysiloxane coating) is both soft and brittle. The strain to microcracking/hardness performance of MR5 is also shown in FIG. 3. It was found that other wet chemical polysiloxane coatings performed similarly.

Preliminary solid-state Nuclear Magnetic Resonance characterization and density measurements indicate that Margard MR5 is highly crosslinked yet has low density, while the coatings described in Example A below are not as highly crosslinked but are more dense. This may explain why MR5 is soft yet brittle, while the coatings of the present invention are harder yet more flexible.

The results presented in FIG. 3 suggest that ion assisted deposition of dense $SiO_2$, using high $O_2$/organosilicon flow rate ratios, produces hard and brittle material. Based on these data, it is further contended that oxygen rich organosilicon precursors, such as tetramethoxysilane, also generate highly crosslinked and brittle materials, particularly if the coatings are made by plasma polymerization processes. In the absence of ion bombardment, deposition of dense coatings on temperature sensitive substrates requires high W/FM conditions which causes a high degree of monomer fragmentation, and therefore, high crosslinking densities.

Figure 4:
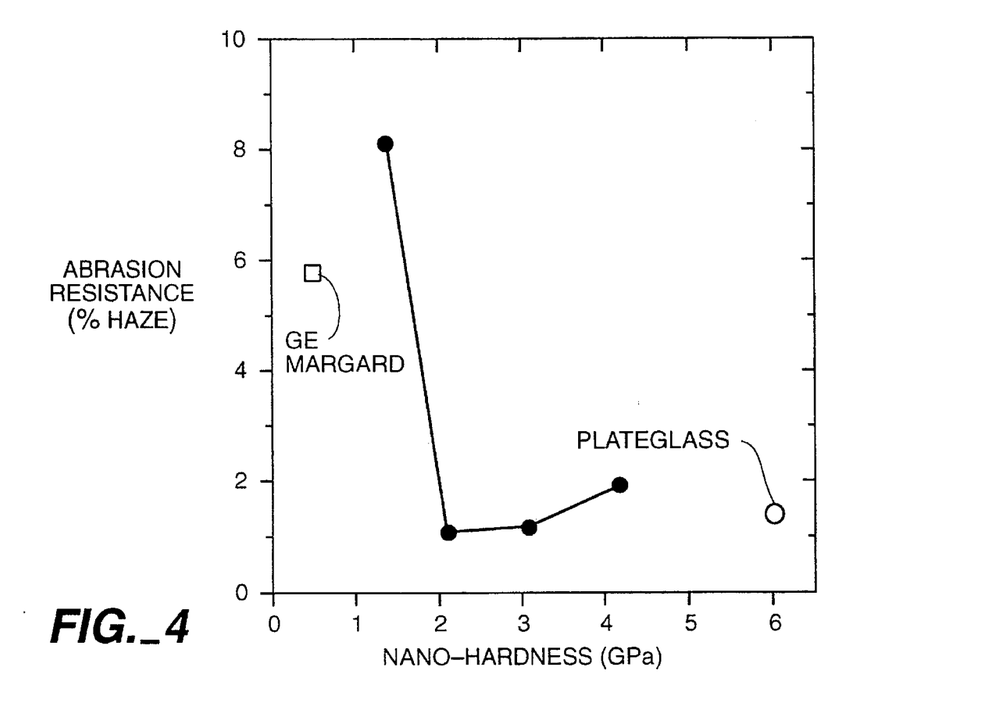
FIG. 4 is a graph of Taber abrasion as a function of the hardness of some of the coatings of the present invention.

In FIG. 4, the Taber abrasion performance (CS10 wheels, 300 cycles, 500 g/wheel) of the radio frequency plasma-deposited coatings described in Example A below, is plotted as a function of the coating hardness. Data points for MR5 and plateglass (S-31) are also shown in FIG. 4. Totally unexpectedly, it was found that the RF plasma-deposited coatings of the present invention with hardness as low as 2 GPa experienced as little or less damage in this severe abrasion test than the much harder plateglass (with 6 GPa hardness). The coatings with hardness greater than 2 GPa clearly provide much better abrasion protection than does MR5. In addition, these coatings have very good optical properties, and are also flexible as FIG. 3 shows.

The surprising abrasion performance may in fact be due to the high strain to microcracking of these coatings. Soft substrates provide little mechanical support for the coating against penetration of abrading asperities. The onset of the coating failure, which is initiated by tensile fracture at the coating-substrate interface, occurs at lower penetration depths with brittle coatings. In addition, deep scratches in brittle coatings are usually more noticeable due to debris formation, jagged edges, and wider scratch grooves, all of which tend to scatter light.

These results were substantiated by scratch testing performed using a Nano Instruments nanoindentor. In this scratch test, the width of scratches was smallest on the coatings of the present invention when compared to glass and other commercially available coatings on polymer substrates.

The following describes several different forms of the abrasion-resistant coating. In the simplest case, the deposition process conditions are not changed during the coating process, resulting in a single layer coating. The single layer coating can be from about 1 to about 100 microns thick in order to provide the required abrasion protection. A variety of different substrate materials can be coated including but not limited to polymethylmethacrylate, polycarbonate, acrylics, poly(allyl diglycolcarbonate) which is also known as "CR-39", and co-polymers and blends thereof; soft metals such as copper, brass and aluminum. Products which can benefit from this coating include but are not limited to sunglass lenses (both plano and ophthalmic), safety lenses, ophthalmic lenses, bar code scanner windows, and ornamental hardware such as brass switch plates. Polymer substrates may be coated with an adhesion-enhancing layer of less than 10 microns thickness from materials including but not limited to acrylic or polysiloxane polymers.

In the second case, a multiple layer coating, with DLC as the top layer, is deposited. DLC is an outstanding abrasion-resistant material. Therefore, for cases where an extremely hard, inert, abrasion-resistant coating is required, DLC is a preferred coating. It has been found that deposition of interlayer materials which contain silicon atoms onto the substrate prior to deposition of the DLC layer results in highly adherent DLC coatings with outstanding wear resistance properties. It is currently believed that reaction between silicon atoms in the interlayer material and the carbon atoms in the DLC layer is critical for the DLC coating to exhibit excellent adhesion. Therefore, the coating of the present invention is an excellent adhesion layer for the DLC.

It is advantageous to deposit the DLC layer immediately following the deposition of the adhesion promoting layer to minimize the possibility of re-contamination of the interlayer surface with vacuum chamber residual gases or other contaminants. The thickness of the DLC coating can be between 50 Å and approximately 100 microns. Thinner DLC coatings, on the order of 50 Å are useful when the main function of the DLC layer is to provide a low-friction surface, or chemical protection. Other low friction layers, such as boron nitride, tin oxide, indium tin oxide, aluminum oxide and zirconium oxide, can be used with the present invention. Thicker DLC layers are useful when protection from severe abrasion is required.

Several deposition methods may be used for the formation of the DLC coatings of the present invention, including but not limited to direct ion beam deposition, and radio frequency plasma deposition as in U.S. Pat. No. 4,382,100. Methane or cyclohexane are preferred as the hydrocarbon source gases, but other hydrocarbon gases, such as acetylene, butane, and benzene can be used as well. Hydrogen and inert gases, e.g. argon, krypton, and xenon, may be introduced into the ion source plasma to modify the DLC film properties. The ion impact energy used in the DLC deposition process may be in the range of approximately 20 eV to approximately 1000 eV. Ion energies in the range of about 20 eV to about 300 eV are most preferred to minimize heating of the substrate during deposition.

In another case, the abrasion-resistant coating may comprise multiple layers of materials with at least two different refractive indicies. The coatings of the present invention may be used as either a low refractive index layer, e.g. refractive index of approximately 1.5, or the high refractive index layer. Additionally, other high index optical materials known in the art, such as titanium dioxide and zirconium oxide may be used as the high index layer. If properly designed and deposited, as is know in the prior art, these coatings may be anti-reflective in the visible spectrum. Additionally, highly reflective coatings can also be designed and deposited in a similar fashion using techniques known in the prior art. The materials with different refractive indices can be produced by changing the deposition conditions, e.g. precursor gases, pressures, etc.

Once the chosen thickness of the top coating layer has been achieved, the deposition process on the substrates is terminated, the vacuum chamber pressure is increased to atmospheric pressure, and the coated substrates are removed from the vacuum chamber.

The examples which follow illustrate the superior performance of the method of this invention. The examples are for illustrative purposes only and are not meant to limit the scope of the claims in any way.

EXAMPLE A

In this example, a series of coatings were deposited on 7" diameter optical grade polycarbonate discs (⅛" thick), which were set on the powered electrode of a Plasmalab 80 radio-frequency diode reactor. The substrates were purchased with protective cling wrap, which was removed as the last step prior to pump down. In each run the vacuum chamber was then evacuated to a pressure less than $5 \times 10^{-3}$ Torr. Each substrate was plasma cleaned in a $O_2$ plasma (100 mTorr, 50 Watts (W)) for 2 minutes. This removed nearly 3000 Å of polycarbonate. The $O_2$ plasma was extinguished, and then mixtures of hexamethyldisiloxane (HMDSO) and $O_2$ were admitted to the vacuum system. The power was set at 300 W. During the initial 30 seconds of deposition the pressure was maintained at $5 \times 10^{-2}$ Torr, while the remaining 10 min. of deposition were carried out at $1 \times 10^{-1}$ Torr. At $5 \times 10^{-2}$ Torr, a bias of −450 V was measured (with the electrode exposed), while at $1 \times 10^{-1}$ Torr the bias was −400 V. The electrode temperature was maintained at 20° C. The chamber was vented and the substrates were removed. Indentation hardness measurements were obtained using a Nanoinstruments nanoindenter. Strain to microcracking measurements were carried out by bending 1 cm×10 cm strips cut from each sample over a four point bending fixture, with onset of microcracking visually determined. The strain to microcracking values were then calculated from the critical radii of curvature. The samples were Taber abraded by CS10 wheels for 300 cycles using 500 g weights. The abrasion damage was quantified by the difference in haze before and after abrasion. Haze values were obtained in accordance to ASTM D1003, using a Gardner hazemeter. Values for the yellow index ($Y_I$) were calculated from transmission spectra in the visible range according to ASTM D1925. The strain to microcracking and Taber abrasion results are shown as functions of the indentation hardness in FIGS. 3 and 4, respectively, and the results of the other characterizations are presented below in Table 1.

TABLE 1

| HMDSO (sccm) | $O_2$ (sccm) | Thickness (microns) | Hardness (GPa) | Haze (%) | Yellow Index |
|---|---|---|---|---|---|
| 131 | 0 | 12.8 | 1.4 | 2.7 | 1.8 |
| 99 | 33 | 12.3 | 2.1 | 1.8 | 1.4 |
| 66 | 66 | 10.1 | 3.1 | 1.3 | 3.5 |
| 33 | 100 | 6.1 | 4.2 | 0.96 | 4.6 |

The three coatings made from mixtures of HMDSO and $O_2$ are flexible and softer than glass, yet exhibit excellent abrasion resistance. They exhibit good optical properties in that they are highly transmissive in the visible, and have yellow index and haze values less than 5 and 2%, respectively. The yellow index values were obtained several days after the samples were made. It was observed in the course of this investigation that those radio frequency-deposited organosilicon samples that are produced with visible yellowness (with yellow index greater than 2.5), particularly those grown from organosiloxane feed gases, undergo a noticeable reduction in color when they are exposed to ambient conditions.

EXAMPLE B

Two 2"×2"×0.125" CR-39 flat substrates, a CR-39 lens, a 2"×2"×0.125" polycarbonate substrate and a 3" diameter Si(001) wafer were ultrasonically cleaned in isopropanol followed by drying with nitrogen gas. The samples were mounted on a 18-inch" diameter aluminum plate with Kapton tape and the plate was mounted in a stainless steel vacuum chamber which was subsequently evacuated to a pressure of $4.4 \times 10^{-5}$ Torr by a 10" diameter diffusion pump. The samples were sputter etched for 5 minutes with an argon ion beam generated in an End Hall ion source (manufactured by Commonwealth Scientific as Mark II) using 10 sccm argon gas introduced directly into the plasma chamber of the ion source. The anode potential was 30 volts while the current was 5.8 amps (ion beam current approximately 1.15 amps). The electron source for the End Hall ion source was a hollow cathode operated on 3 sccm argon gas. After sputter-etching the substrates, approximately 16 sccm of octamethylcyclotetrasiloxane was introduced into the argon beam through nozzles located approximately 1" downstream of the ion source. The anode potential was 58 volts while the anode current was 5.8 amps (ion beam current approximately 1.5 amps). After operating for 3.5 minutes with these conditions, 10 sccm of oxygen gas was introduced. After operating for an additional 30 seconds, the oxygen flow was increased to 30 sccm. After an additional 30 seconds, the oxygen flow was increased to 50 sccm. After an additional 30 seconds, the oxygen flow was increased to 70 sccm and the argon was shut off. The anode potential was 56 volts and the anode current was 5.72 amps (ion beam current approximately 1.5 amps). The chamber pressure was $1.45\times10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. Approximately 5.5 microns of coating was deposited onto the samples.

The stress of the coating was $7.7\times10^8$ dynes/cm$^2$. The haze measured on the CR-39 samples was less than 0.4%. The 2"×2"×0.125" piece of coated CR-39 was tested with a Taber abrader using 500 grams load with CS-10F wheels (total of 1 kg load). After 500 cycles, the change in haze was determined to be 0.65%. Glass tested in an identical fashion had a change in haze of 0.69% haze after 500 cycles. The coating contained carbon, silicon, oxygen, and hydrogen.

EXAMPLE C

Two CR-39 lenses, and two CR-39 2"×2"×0.125" pieces were ultrasonically cleaned in isopropanol and then dried using nitrogen gas. The samples were mounted on a 18-inch diameter aluminum disk with Kapton tape. The disk was mounted in a stainless steel vacuum chamber which was pumped with a 10" diffusion pump. The chamber was evacuated to a pressure of $1.6\times10^{-5}$ Torr. The samples were sputter-etched for 5 minutes using an argon ion beam generated in the End Hall ion source used in Example B with 17.4 sccm of argon gas directly into the plasma chamber of the ion source, an anode potential of 80 volts, and an anode current of 4.22 amps (ion beam current approximately 0.85 amp). The electron source for the End Hall ion source was a hollow cathode. A shutter was then placed between the ion source and the substrates to block the ion beam, and 100 sccm of oxygen gas was run into the plasma chamber of the ion source, the argon was turned off, and octamethylcyclotetrasiloxane was allowed into the chamber through nozzles located approximately 1" downstream of the ion source. The anode potential was 72 volts and the anode current was 5.57 amps (ion beam current approximately 1.2 amps). The pressure during this process was $1.25\times10^{-3}$ Torr. After 72 minutes of operation at this condition, the ion source plasma and ion beam were extinguished and the chamber was brought to atmospheric pressure, and the substrates were removed. The samples were water-clear in visible light. The coating thickness was 7.6 microns and the compressive stress was $5.7\times10^8$ dynes/cm$^2$. The hardness of the coating (measured by nanoindentation) was 3.4 GPa. For reference, the hardness of quartz measured by the same technique was 10 GPa.

EXAMPLE D

A thin (0.005 inch) PET film was tensioned over a nearly flat but slightly curved saddle-shaped electrode in the Plasmalab 80 reactor. After a one minute $O_2$ plasma pretreatment (0.1 Torr, 50 W) a 1:1 mixture of hexamethyldisiloxane:$O_2$ (100 sccm of each) was admitted into the chamber and deposition was carried out for 4 minutes at 0.15 Torr pressure with 250 W power and the electrode temperature at 20° C. A colorless, clear coating approximately 4 μm thick was produced. The PET side of this sample was then laminated onto soft 0.03 inch PVC film. While the resulting article was very flexible, and could be bent to a radius of curvature less than 0.3 cm without damage, the coated side of the laminate was very scratch resistant to #0 grade steel wool. Similar coatings on PET film substrates exhibited glass-like abrasion resistance to Taber abrasion.

EXAMPLE E

Two 2"×2"×0.125" CR-39 flat substrates, a CR-39 lens, a 2"×2"×0.125" polycarbonate substrate, a 8" diameter× 0.125" thick polycarbonate substrate and a 3" diameter Si(001) wafer were ultrasonically cleaned in isopropanol followed by drying with nitrogen gas. The samples were mounted on 8.5" diameter disks with Kapton tape and the disks were mounted in a stainless steel vacuum chamber on a planetary drive which was subsequently evacuated to a pressure of $5\times10^{-6}$ Torr by a 10" diameter diffusion pump. The samples were sputter etched for 2 minutes with an argon ion beam generated in the End Hall ion source (used in the above examples) using 3 sccm argon gas introduced directly into the plasma chamber of the ion source. The anode potential was 50 volts while the current was 5.6 amps. The electron source for the End Hall ion source was a hollow cathode operated on 3 sccm argon gas. After sputter-etching the substrates, approximately 16 sccm of octamethylcyclotetrasiloxane was introduced into the argon beam through nozzles located approximately 1" downstream of the ion source. The anode potential was 59 volts while the anode current was 5.8 amps (ion beam current approximately 1.5 amps). After operating for 3.0 minutes with these conditions, 70 sccm of oxygen gas was introduced into the plasma chamber of the ion source and the argon flow was reduced to 0.0 sccm. The anode potential was 57 volts and the anode current was 5.79 amps (ion beam current approximately 1.5 amps). The chamber pressure was $1.4\times10^{-3}$ Torr. The ion source plasma and ion beam were extinguished 40 minutes after the first introduction of the octamethylcyclotetrasiloxane. The chamber was brought to atmospheric pressure and the samples were removed. The coated samples were water-clear when viewed in visible light. Approximately 4.8 microns of coating was deposited onto the samples.

The stress of the coating was $6.4\times10^8$ dynes/cm$^2$. The tensile strain to microcracking of the coating was determined using a four point bend technique. Coated polycarbonate pieces, 1 cm×10 cm, were cut from the 8" diameter disk and mounted in the four point bend apparatus. The samples were bent until microcracking of the coating was observed. The radius of curvature was measured and the strain was calculated. The results indicate that the strain to microcracking was 2.1–2.2%.

All of the examples demonstrate highly optically transparent, water-clear, low-stress, adherent, hard, abrasion-resistant coatings containing silicon, carbon, oxygen, and hydrogen, which coatings can be deposited onto plastic substrates at high deposition rates. These coatings exhibited hardness between that of wet chemical-produced polysiloxane coatings and that of glass. When applied to plastic substrates, these coatings, which contain silicon, carbon, oxygen, and hydrogen, produced Taber abrasion resistance test results equivalent to that of glass. These coatings are particularly useful in applications where optical plastic substrates require improved abrasion protection (e.g. plastic sunglass or ophthalmic lenses). Similar coatings which contain nitrogen can be made.

A unique advantage of the use of the ion beam method for producing these materials is the relationship between stress and hardness. It is well known in the prior art that stress and hardness are often strongly related. Typically, the greater the compressive stress, the harder the material. For the case of the Si, C, O, H materials produced by injecting siloxane precursors into an oxygen ion beam, it was unexpectedly found that by increasing the ratio of oxygen to siloxane precursor, the coating hardness was increased, while the compressive stress was simultaneously decreased. By this method, it is possible to produce hard, abrasion-resistant coatings which are under tensile stress, or are nearly stress-free. This is a very unexpected result for an energetic deposition process, and a key technical advantage of the ion beam process.

It is believed that the reduction in compressive stress with increasing hardness is due to the etching of carbon from the growing surface by the oxygen ions, or activated oxygen in the ion beam. It has been observed by Energy Dispersive Spectroscopy that the carbon signal in the deposited coatings decreases with increasing oxygen flow rate for a fixed siloxane precursor flow rate. It is believed that the reduction in compressive stress with increasing hardness is unique to the ion beam process of the present invention.

Using radio frequency plasma or ion beam processes to deposit the coatings of the present invention, very high deposition rates can be achieved while maintaining low substrate temperature. The coatings are very adherent and provide outstanding abrasion protection. For example, coated plastic substrates such as lenses, which have abrasion resistance equal to that of glass can be produced. Because of the high coating deposition rates which can be attained, the invention provides an economical manufacturing process.

From the foregoing description, one of ordinary skill in the art can easily ascertain that the present invention provides an improved method for producing highly protective and abrasion-resistant coatings on a variety of substrates, including optical plastics. Highly important technical advantages of the present invention include outstanding adhesion of the coatings, outstanding abrasion resistance, high transparency, high strain to microcracking, and ease and flexibility of mass production.

Without departing from the spirit and scope of this invention, one of ordinary skill in the art can make various changes and modifications to the invention to adapt it to various usages and conditions. As such, these changes and modifications are properly, equitably, and intended to be, within the full range of equivalents of the following claims.

What is claimed is:

1. An abrasion wear resistant coated substrate product comprising a substrate and at least one layer of an abrasion wear resistant coating material comprised of carbon, hydrogen, silicon, and oxygen, using ion-assisted plasma deposition and using mixtures of organosiloxane or organosilazane precursor gases and oxygen; said abrasion wear resistant coating material having the properties of Nanoindentation hardness in the range of about 2 to about 5 GPa, a strain to microcracking of about 2% to about 3%, and an abrasion resistance at least equal to the abrasion resistance of glass.

2. The product of claim 1 wherein said abrasion wear resistant coating material has a transparency greater than 85% in the visible spectrum.

3. The product of claim 1 wherein said abrasion wear resistant coating material undergoes a change in haze of less than 2% as measured by ASTM D1003 during Taber abrasion as described in ASTM D1044.

4. The product of claim 1 wherein the thickness of the abrasion wear resistant coating is in the range of approximately 1 µm to approximately 100 µm.

5. The product of claim 1 wherein the coated substrate product is a vision-correcting ophthalmic lens.

6. The product of claim 5 wherein said wear resistant coating includes multiple layers of at least two different refractive indices to reduce reflection at predetermined wavelengths.

7. The product of claim 1 wherein the coated substrate product is a plano lens.

8. The product of claim 7 wherein said wear resistant coating includes multiple layers of at least two different refractive indices to reduce reflection at predetermined wavelengths.

9. The product of claim 1 wherein the coated substrate product is a sunglass lens.

10. The product of claim 9 wherein said wear resistant coating includes multiple layers of at least two different refractive indices to reduce reflection at predetermined wavelengths.

11. The product of claim 1 wherein the coated substrate product is a safety lens.

12. The product of claim 11 wherein said wear resistant coating includes multiple layers of at least two different refractive indices to reduce reflection at predetermined wavelengths.

13. The product of claim 1 wherein the coated substrate product is a bar code scanner window.

14. The product of claim 13 wherein said wear resistant coating includes multiple layers of at least two different refractive indices to reduce reflection at predetermined wavelengths.

15. The product of claim 1 wherein said substrate is a polymer, and said coated substrate product further comprises an adhesion-enhancing polymer layer between said substrate and said abrasion wear resistant coating.

16. The product of claim 15 wherein said polymer substrate is selected from the group consisting of polymethylmethacrylate, polycarbonate, acrylics, poly(allyl diglycolcarbonate), and co-polymers and blends thereof.

17. The product of claim 16 wherein said adhesion-enhancing polymer layer is selected from the group consisting of an acrylic polymer and a polysiloxane polymer.

18. The product of claim 15 wherein said adhesion-enhancing polymer layer is less than 10 µm thick.

19. The product of claim 15 wherein the thickness of said abrasion wear resistant coating is in the range of approximately 1 µm to approximately 100 µm.

20. The product of claim 15 wherein said coated substrate product is a vision-correcting ophthalmic lens.

21. The product of claim 20 wherein said wear resistant coating includes multiple layers of at least two different refractive indices to reduce reflection at predetermined wavelengths.

22. The product of claim 15 wherein said coated substrate product is a plano lens.

23. The product of claim 22 wherein said wear resistant coating includes multiple layers of at least two different refractive indices to reduce reflection at predetermined wavelengths.

24. The product of claim 15 wherein said coated substrate product is a sunglass lens.

25. The product of claim 24 wherein said wear resistant coating includes multiple layers of at least two different refractive indices to reduce reflection at predetermined wavelengths.

26. The product of claim 15 wherein said coated substrate product is a safety lens.

27. The product of claim 26 wherein said wear resistant coating includes multiple layers of at least two different refractive indices to reduce reflection at predetermined wavelengths.

28. The product of claim 15 wherein said coated substrate product is a bar code scanner window.

29. The product of claim 28 wherein said wear resistant coating includes multiple layers of at least two different refractive indices to reduce reflection at predetermined wavelengths.

30. The product of claim 1 wherein said abrasion-resistant material also contains nitrogen.

31. An optically transparent, abrasion wear resistant coated substrate product comprising a substrate and at least one layer of an abrasion wear resistant coating material comprised of carbon, hydrogen, silicon, and oxygen, using ion-assisted plasma deposition, and mixtures of organosiloxane or organosilazane precursor gases and oxygen; said abrasion wear resistant coating material having the properties of Nanoindentation hardness in the range of about 2 to about 5 GPa, a strain to microcracking of about 2% to about 3%, a transparency greater than 85% throughout the visible spectrum, a yellow index of less than 5, a haze of less than 2%, and an abrasion resistance of at least equal to the abrasion resistance of glass.

32. The product of claim 31 wherein said abrasion wear resistant coating material undergoes a change in haze of less than 2% as measured by ASTM D1003 during Taber abrasion as described in ASTM D1044.

33. The product of claim 31 wherein said abrasion wear resistant coating material also contains nitrogen.

34. The product of claim 31 wherein the thickness of the abrasion wear resistant coating is in the range of approximately 1 μm to approximately 100 μm.

35. The product of claim 31 wherein the coated substrate product is a vision-correcting ophthalmic lens.

36. The product of claim 35 wherein said wear resistant coating includes multiple layers of at least two different refractive indices to reduce reflection at predetermined wavelengths.

37. The product of claim 31 wherein the coated substrate product is a plano lens.

38. The product of claim 37 wherein said wear resistant coating includes multiple layers of at least two different refractive indices to reduce reflection at predetermined wavelengths.

39. The product of claim 31 wherein the coated substrate product is a sunglass lens.

40. The product of claim 39 wherein said wear resistant coating includes multiple layers of at least two different refractive indices to reduce reflection at predetermined wavelengths.

41. The product of claim 31 wherein the coated substrate product is a safety lens.

42. The product of claim 41 wherein said wear resistant coating includes multiple layers of at least two different refractive indices to reduce reflection at predetermined wavelengths.

43. The product of claim 31 wherein the coated substrate product is a bar code scanner window.

44. The product of claim 43 wherein said wear resistant coating includes multiple layers of at least two different refractive indices to reduce reflection at predetermined wavelengths.

45. The product of claim 31 wherein said substrate is a polymer, and said coated substrate product further comprises an adhesion-enhancing polymer layer between said substrate and said abrasion wear resistant coating.

46. The product of claim 45 wherein said polymer substrate is selected from the group consisting of polymethylmethacrylate, polycarbonate, acrylics, poly(allyl diglycolcarbonate), and co-polymers and blends thereof.

47. The product of claim 45 wherein said adhesion-enhancing polymer layer is selected from the group consisting of an acrylic polymer and a polysiloxane polymer.

48. The product of claim 45 wherein said adhesion-enhancing polymer layer is less than 10 μm thick.

49. The product of claim 45 wherein the thickness of said abrasion wear resistant coating is in the range of approximately 1 μm to approximately 100 μm.

50. The product of claim 45 wherein said coated substrate product is a vision-correcting ophthalmic lens.

51. The product of claim 50 wherein said wear resistant coating includes multiple layers of at least two different refractive indices to reduce reflection at predetermined wavelengths.

52. The product of claim 45 wherein said coated substrate product is a plano lens.

53. The product of claim 52 wherein said wear resistant coating includes multiple layers of at least two different refractive indices to reduce reflection at predetermined wavelengths.

54. The product of claim 45 wherein said coated substrate product is a sunglass lens.

55. The product of claim 54 wherein said wear resistant coating includes multiple layers of at least two different refractive indices to reduce reflection at predetermined wavelengths.

56. The product of claim 45 wherein said coated substrate product is a safety lens.

57. The product of claim 56 wherein said wear resistant coating includes multiple layers of at least two different refractive indices to reduce reflection at predetermined wavelengths.

58. The product of claim 45 wherein said coated substrate product is a bar code scanner window.

59. The product of claim 58 wherein said wear resistant coating includes multiple layers of at least two different refractive indices to reduce reflection at predetermined wavelengths.

60. An abrasion wear resistant coated substrate product comprising a substrate and an abrasion wear resistant coating material comprised of carbon, hydrogen, silicon, and oxygen, using ion-assisted plasma deposition and using mixtures of organosiloxane or organosilazane precursor gases and oxygen; said abrasion wear resistant coating material having the properties of Nanoindentation hardness in the range of about 2 to about 5 GPa, a strain to microcracking of about 2% to about 3%, and an abrasion resistance of at least equal to the abrasion resistance of glass; and an outer layer of diamond-like carbon.

61. The product of claim 60 wherein said diamond-like carbon layer has a thickness between 50 Å and 10 microns.

62. The product of claim 60 wherein said abrasion wear resistant coating material undergoes a change in haze of less than 2% as measured by ASTM D1003 during Taber abrasion as described in ASTM D1044.

63. The product of claim 60 wherein said abrasion wear resistant coating material also contains nitrogen.

64. The product of claim 60 wherein the thickness of the abrasion wear resistant coating is in the range of approximately 1 μm to approximately 100 μm.

65. The product of claim 60 wherein the coated substrate product is a vision-correcting optical ophthalmic lens.

66. The product of claim 65 wherein said wear resistant coating includes multiple layers of at least two different refractive indices to reduce reflection at predetermined wavelengths.

67. The product of claim 60 wherein the coated substrate product is a plano lens.

68. The product of claim 67 wherein said wear resistant coating includes multiple layers of at least two different refractive indices to reduce reflection at predetermined wavelengths.

69. The product of claim 60 wherein the coated substrate product is a sunglass lens.

70. The product of claim 69 wherein said wear resistant coating includes multiple layers of at least two different refractive indices to reduce reflection at predetermined wavelengths.

71. The product of claim 60 wherein the coated substrate product is a safety lens.

72. The product of claim 71 wherein said wear resistant coating includes multiple layers of at least two different refractive indices to reduce reflection at predetermined wavelengths.

73. The product of claim 60 wherein the coated substrate product is a bar code scanner window.

74. The product of claim 73 wherein said wear resistant coating includes multiple layers of at least two different refractive indices to reduce reflection at predetermined wavelengths.

75. The product of claim 60 wherein said substrate is a polymer, and said coated substrate product further comprises an adhesion-enhancing polymer layer between said substrate and said abrasion wear resistant coating.

76. The product of claim 75 wherein said polymer substrate is selected from the group consisting of polymethylmethacrylate, polycarbonate, acrylics, poly(allyl diglycolcarbonate), and co-polymers and blends thereof.

77. The product of claim 75 wherein said adhesion-enhancing polymer layer is selected from the from the group consisting of an acrylic and polysiloxane polymer material.

78. The product of claim 75 wherein said adhesion-enhancing polymer layer is less than 10 μm thick.

79. The product of claim 75 wherein the thickness of said abrasion wear resistant coating is in the range of approximately 1 μm to approximately 100 μm.

80. The product of claim 75 wherein said coated substrate product is a vision-correcting ophthalmic lens.

81. The product of claim 80 wherein said wear resistant coating includes multiple layers of at least two different refractive indices to reduce reflection at predetermined wavelengths.

82. The product of claim 75 wherein said coated substrate product is a plano lens.

83. The product of claim 82 wherein said wear resistant coating includes multiple layers of at least two different refractive indices to reduce reflection at predetermined wavelengths.

84. The product of claim 75 wherein said coated substrate product is a sunglass lens.

85. The product of claim 84 wherein said wear resistant coating includes multiple layers of at least two different refractive indices to reduce reflection at predetermined wavelengths.

86. The product of claim 75 wherein said coated substrate product is a safety lens.

87. The product of claim 86 wherein said wear resistant coating includes multiple layers of at least two different refractive indices to reduce reflection at predetermined wavelengths.

88. The product of claim 75 wherein said coated substrate product is a bar code scanner window.

89. The product of claim 88 wherein said wear resistant coating includes multiple layers of at least two different refractive indices to reduce reflection at predetermined wavelengths.

90. A product of a method for depositing onto a substrate an abrasion wear resistant coating material consisting of C, H, Si and O which comprises:

(a) chemically cleaning the surface of said substrate to remove contaminants;

(b) mounting said substrate in a deposition vacuum chamber and evacuating the air from said chamber;

(c) etching the surface of said substrate with a material selected from the group consisting of energetic ions, reactive species and mixtures thereof to further remove residual contaminants, and to activate the surface;

(d) depositing onto the surface of said substrate an intermediate layer of said abrasion wear resistant material by exposing said substrate to a deposition flux of oxygen and organosiloxane or organosilazane precursor gases and generated by a plasma, whereby said deposition flux is activated by said plasma and said substrate is bombarded by energetic ions during the deposition;

(e) depositing onto said intermediate layer an outer layer of diamond-like carbon having a thickness between 50 Å and 100 microns;

(f) increasing the vacuum chamber pressure to atmospheric pressure; and (g) recovering a product coated with said abrasion wear resistant material having the properties of Nanoindentation hardness in the range of about 2 to about 5 GPa, a strain to microcracking of about 2% to about 3%, and an abrasion resistance of at least equal to the abrasion resistance of glass.

91. A product of a method for depositing onto a substrate an abrasion wear resistant coating material consisting of C, H, Si and O which comprises:

(a) chemically cleaning the surface of said substrate to remove contaminants;

(b) mounting said substrate in a deposition vacuum chamber and evacuating the air from said chamber;

(c) etching the surface of said substrate with a material selected from the group consisting of energetic ions, reactive species and mixtures thereof to further remove residual contaminants, and to activate the surface;

(d) depositing onto the surface of said substrate an intermediate layer of said abrasion wear resistant material by exposing said substrate to a deposition flux of oxygen and organosiloxane or organosilazane precursor gases and generated by a plasma, whereby said deposition flux is activated by said plasma and said substrate is bombarded by energetic ions during the deposition;

(e) increasing the vacuum chamber pressure to atmospheric pressure; and (f) recovering a product coated with said abrasion wear resistant material having the properties of Nanoindentation hardness in the range of about 2 to about 5 GPa, a strain to microcracking of about 2% to about 3%, and an abrasion resistance of at least equal to the abrasion resistance of glass.

* * * * *